United States Patent [19]

Ying-Chang

[11] Patent Number: 5,132,610
[45] Date of Patent: Jul. 21, 1992

[54] DIGITIZING POWER METER
[76] Inventor: Liu Ying-Chang, 4 Fl., No. 10, Alley 59, Lane 42, Minchuan Rd., Hsin Tien, Taipei, Taiwan
[21] Appl. No.: 476,260
[22] Filed: Feb. 7, 1990
[51] Int. Cl.[5] .................................................. G01R 21/06
[52] U.S. Cl. ................................... 324/142; 364/483
[58] Field of Search ......................... 324/142, 96, 107; 364/483

[56] References Cited
U.S. PATENT DOCUMENTS
4,126,825 11/1978 Houston et al. ................. 324/96
4,217,545 8/1980 Kusui et al. ..................... 324/142

Primary Examiner—Ernest F. Karlsen
Attorney, Agent, or Firm—Asian Pacific Int'l Patent and Trademark Office

[57] ABSTRACT

A digitizing power meter for measuring voltage and current's root-mean-square, average power and power factor, which includes a voltage detector circuit and a current detector circuit to measure voltage and current analog signal; a phase-lock circuit, a voltage Sampling-/Holding circuit, a current Sampling/Holding circuit, a trigger circuit, a voltage A/D converter and a current A/D converter to convert analog signal to measure to digital signal; and a digital processing circuit to accurately measure out voltage and current's root-mean-square, average power and power factor by means of the operation of its microprocessor.

2 Claims, 4 Drawing Sheets

DIGITIZING POWER METER

BACKGROUND OF THE INVENTION

The conventional measuring instrument for measuring voltage, current, average power and power factor generally utilize analog circuits for counting. Disadvantages of the analog circuit counting process are its low accuracy, poor stability, and high error rate. It is inevitable that the error varies with the voltage and waveform of electric current. For example, when a current signal having a sine wave character passes through a SCR circuit or other type of rectifier circuit, its output waveform will be distorted into a non-standard sine wave. Although there are digital power meters being developed for power measuring, none of them is satisfactory for measuring voltage true root-mean-square, current true root-mean-square, average power and power factor. The present invention provides a digitizing power meter which is accurate in use and which can eliminate the above problems. Advantages of a digitizing power meter in accordance with the present invention include:

1. High accuracy in measuring voltage root-mean-square, current root-mean-square, average power and power factor; (i.e. Accuracy)
2. Capability for measuring voltage and current signal of any waveform;
3. Capability for measuring DC signal Bandwidth up to 100 KHZ, and monitoring its measuring operation by means of a voltage monitor and current monitor;
4. Simple structure, no phase error, and measuring range selectability;
5. Easy to operate through keyboard control; with automatic correction by a microprocessor;
6. High accuracy operation through digital integration, free from influence of temperature and environment;
7. IEEE-488 Interface for connection to other equipment.

An embodiment of the present invention utilizes a voltage divider circuit, a current divider circuit and a voltage/current isolating amplifier, instead of the voltage transformer and current transformer that are used in conventional power meters. The measuring instrument of this invention is capable of measuring the power of any low frequency signal and various DC signals. Because of the advantages of simple structure, no phase error and variable measuring range, the present invention provides a convenient power measuring operation.

SUMMARY OF THE INVENTION

An object of the present invention is to provide a digitizing power meter for accurately measuring voltage's root-mean-square, current's root-mean-square, average power and power factor. The invention utilizes a high speed analog-digital converter to divide a cycle of voltage's, current's waveform into N equal parts for a digitization process. The digitized signal is further stored in a memory, and the voltage and current's root-mean-square, average power and power factor are accurately measured out by means of digital integration.

Another object of the present invention is to provide a digitizing power meter which is easy to operate, can eliminate human error by means of auto-correction through keyboard control, and store the correcting value in a memory.

DETAILED DESCRIPTION OF THE PREFERRED EMBODIMENTS

Figure 1:
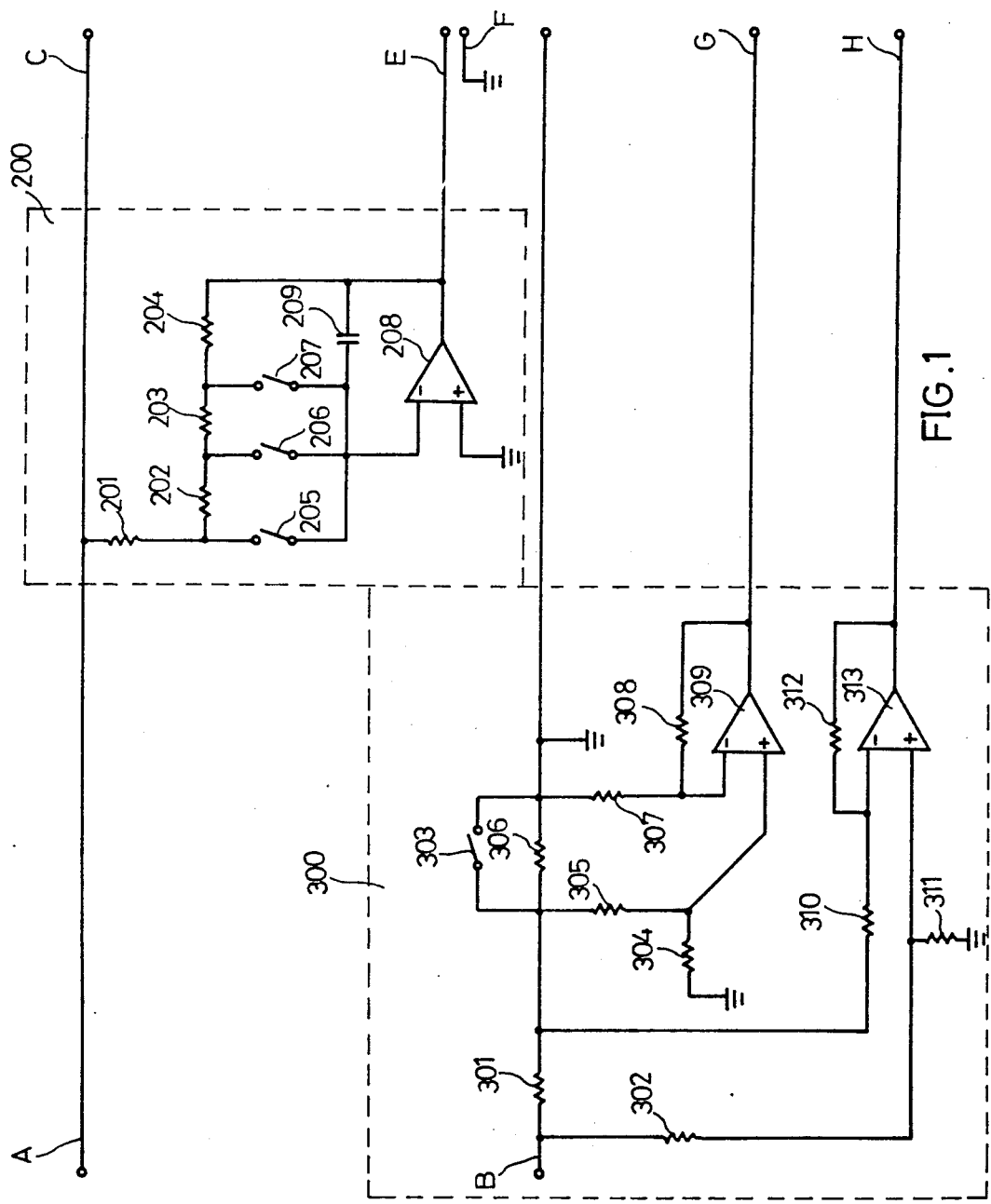
FIG. 1 is a voltage and current detecting circuit diagram according to the present invention.

Referring to the voltage and current detecting circuit diagram of FIG. 1, Operational Amplifier (208), Resistors (201) (202) (203) (204), Capacitor (209) and Switches (205) (206) (207) form a Voltage Range Selector (200). Through the alternative operation of the Switches (205) (206) (207) a proper voltage range can be measured. Voltage signal is inputted through input terminal A and sent to output terminal E for output to the circuit shown in FIG. 2. There is a Current Range Selector (300) for high-low range selection, in which Operational Amplifier (309) and Resistors (304) (305) (306) (307) (308) form a Differential Amplifier for amplifying the current which passes through the Low Range current Detecting Resistor (306). Operational Amplifier (313) and Resistors (302) (310) (311) (312) form a Differential Amplifier for amplifying the current which passes through the High Range Current Detecting Resistor (301); current signal is inputted through input terminal B. Switch (303) is a high-low range switch for selection of high or low frequency range. The High-Low Range Switch (303) is closed for measuring in the high ampere range, and it is opened for measuring in the low ampere range. The current signals are transmitted through Operational Amplifiers (309) (313) for output through output terminals G and H respectively.

Figure 2:
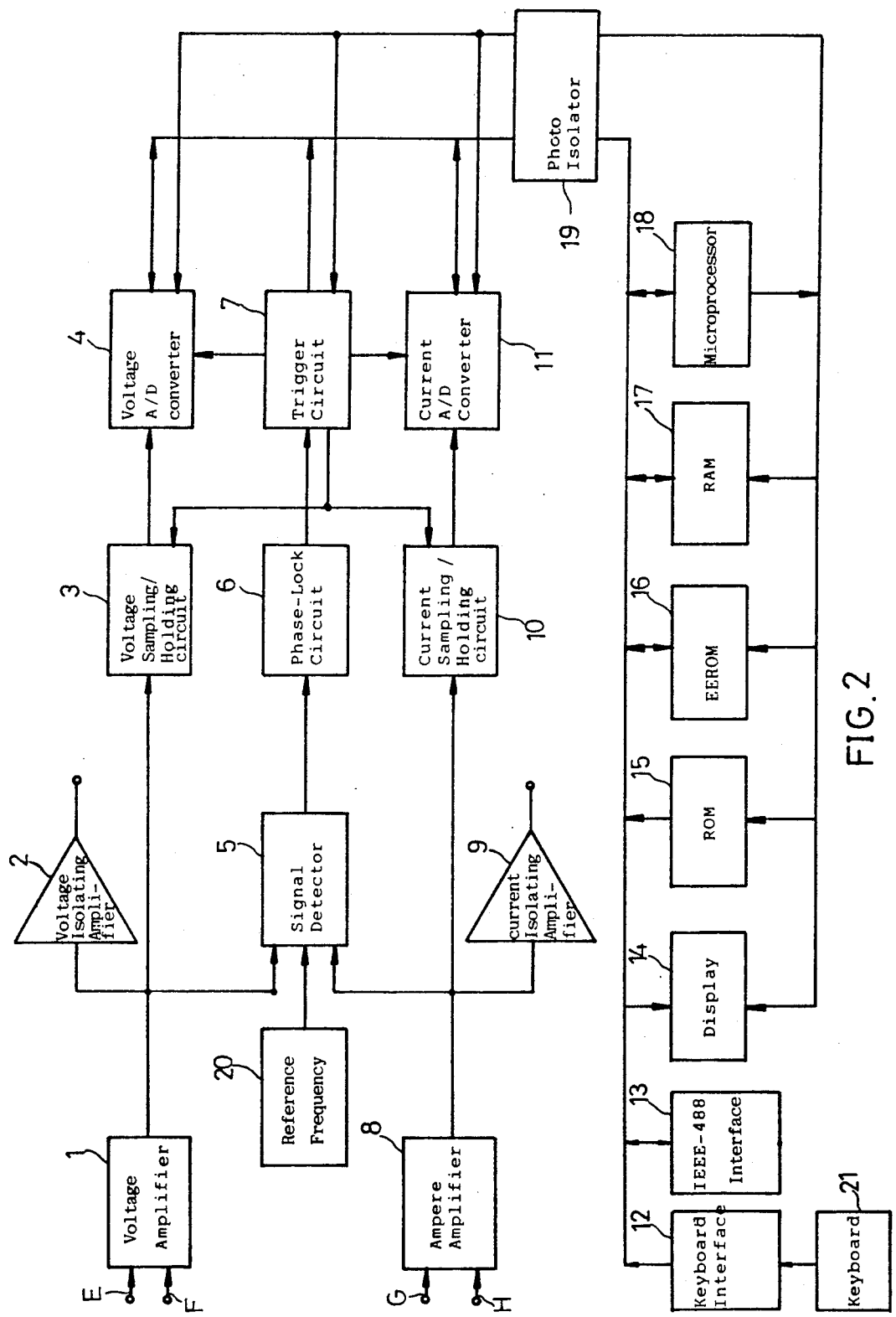
FIG. 2 is a functional block diagram of the present invention.

Referring to FIG. 2, a Voltage Amplifier (1) provides high input impedance and comprises two input terminals, one connected to the aforementioned terminal E and the other connected to an grounding terminal F. Therefore, voltage signal passes through the Voltage Amplifier (1), a Voltage Sampling/Holding Circuit (3) and a Voltage A/D Converter (4), to provide the Data Bus with a digital signal, wherein a Photo Isolator (19) is used to isolate the digital bus from the measuring circuit. Current signal from the aforementioned output terminal G of the Operational Amplifier (309) or the aforementioned output terminal H of the operational Amplifier (313) of FIG. 1 passes through an Ampere Amplifier (8), a Current Sampling/Holding Circuit (10), a Current A/D Converter (11) and the Photo Isolator (19), to provide the Data Bus with a digital signal. By means of the output terminals of the Voltage Amplifier (1) and the Ampere Amplifier (8), analog voltage and ampere signals can be respectively sent through the Voltage Isolating Amplifier (2) and the Current Isolating Amplifier (9) for monitoring and recording purposes.

During the measuring of an AC voltage signal, the signal from the Voltage Amplifier (1) is sent through a Signal Detector (5), where the AC voltage signal is converted to a square wave signal, a Phase-Lock Circuit (6), where the input signal is divided into N equal parts, to a Trigger Circuit (7) to control the Voltage Sampling/Holding Circuit (3) and the Voltage A/D Converter (4) so as to inform a Microprocessor (18) via the Photo Isolator (19). During the measuring of an AC current signal, the signal from the Ampere Amplifier (8) is also sent through the Signal Detector (5), where the AC current signal is converted to a square wave signal, and the Phase-Lock Circuit (6) to the Trigger Circuit (7) to control the Current Sampling/Holding Circuit (10) and the Current A/D Converter (11) so as to further inform the Microprocessor (18) via the Photo Isolator (19). During the measuring of a DC signal, a Reference Frequency (20) is provided to send a power line frequency signal to the Signal Detector (5) so as to convert such a DC signal to a digital signal for further transmission to the Data Bus. The Microprocessor (18) performs operations with the foregoing digitized voltage and current signals by means of a program which is stored in a ROM (15); the work product is displayed on a Display (14). There is an EEROM (16) for storage of correction constant so that the Microprocessor (18) can execute an auto-correcting operation efficiently, to reduce any possible human error. There is a RAM (17) for temporary data storage during the operation of the Microprocessor (18). The digitizing power meter of the present invention is also equipped with an IEEE-488 Interface (13) capable of being connected to other controller equipment or instrument. The interface between the present invention and its user is achieved by means of a Keyboard Interface (12). Therefore, the user can select a suitable voltage and ampere range for measuring and making corrections through a Keyboard (21).

Figure 3:
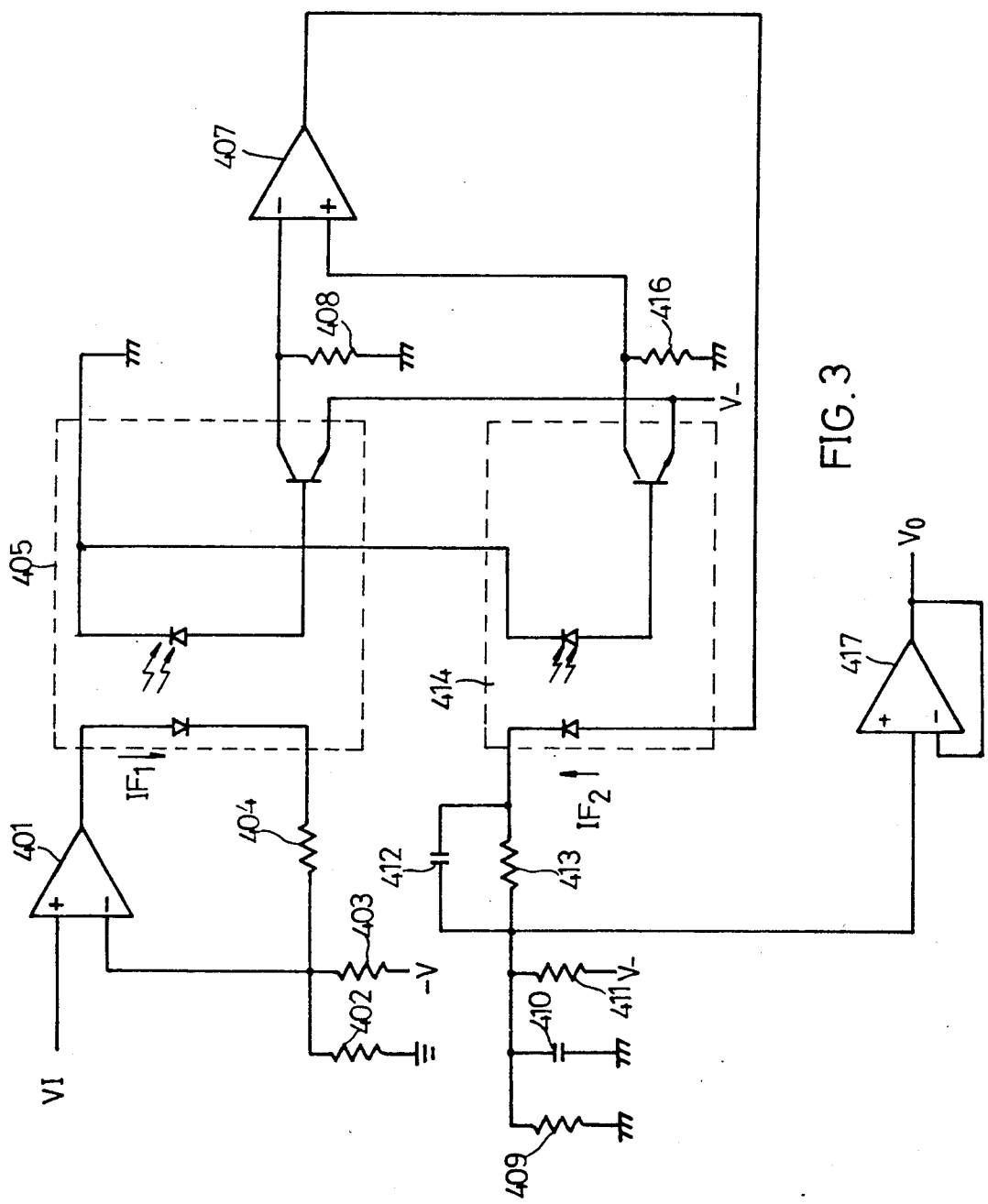
FIG. 3 is a circuit diagram of the voltage sampling-/retaining circuit according to the present invention.

FIG. 3 is a detailed circuit diagram of the Voltage Sampling/Holding Circuit (3) of FIG. 2, in which Photo-couplers (405) (414), Operational Amplifiers (401) (407), Capacitors (410) (412) and Resistors (402) (403) (404) (408) (409) (411) (413) (416) form an Isolating Amplifier. The two Photo-couplers (405) (414) are similar in property. The Operational Amplifier (401) converts input voltage (Vi) to a primary current (IF1) for passing through the Photo-coupler (405). The Operational Amplifier (407) compares the output signals of the two Photo-couplers (405) (414) and forces the secondary current (IF2) of the Photo-coupler (414) to be in proportion to the primary current (IF1) of the Photo-coupler (405). The Resistor (403) and the Resistor (411) produce a constant current so that the Photo-coupler (405) can operate within operating area, and the Resistor (402) determines the range of input voltage (Vi). Therefore, the value of IF1 is constantly the same as that of IF2. Further, the value of resistance of the Resistor (402) is equal to that of the Resistor (409), and the value of resistance of the Resistor (403) is equal to that of the Resistor (411). Therefore, the value of input voltage (Vi) is constantly equal to the value of output voltage (Vo). However, the grounding circuit between the input and output has been isolated by means of light conduction, and the isolation voltage at both signal ends is determined according to the isolation voltage at both sides of the Photo-couplers (generally 3 KV dc insulation voltage). Buffer (417) amplifies the voltage from the Resistor (409) to provide a signal of low output impedance to a waveform monitor or recorder for monitoring or recording its voltage and ampere. At the same time, the Capacitors (410) (412) compensate the frequency-response characteristic of the circuit to eliminate any single pole slope dropping problem due to peak phenomenon. The frequency-response characteristic of this circuit is effective from DC to 100 KHZ (−3 db). It provides a high isolating voltage and common mode rejection ratio, and low gain and offset drifting.

Figure 4:
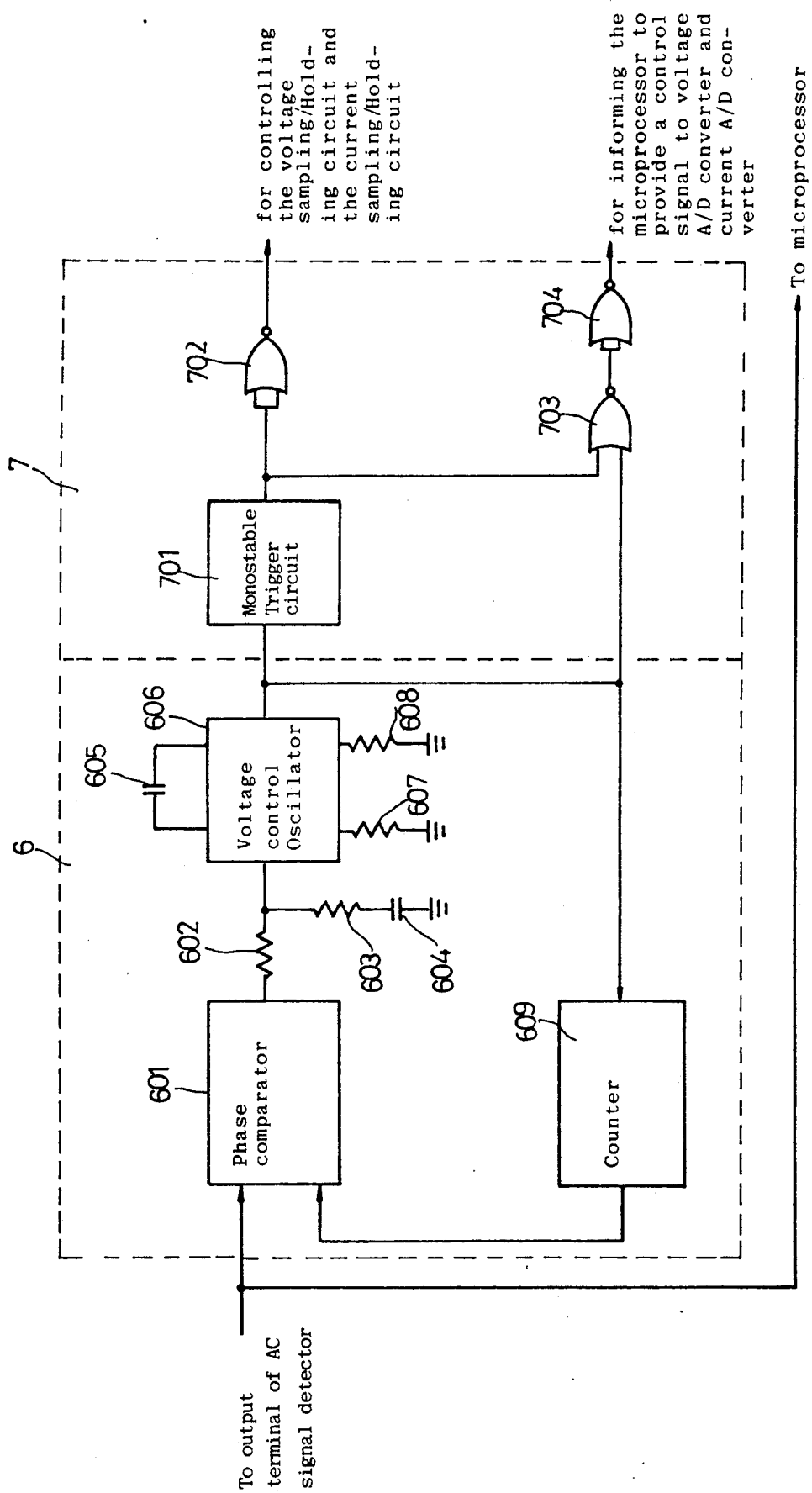
FIG. 4 is a circuit diagram of the phase-lock circuit and the trigger circuit according to the present invention.

FIG. 4 is a circuit diagram of the phase-lock circuit 6 and the trigger circuit 7 according to the present invention. The output terminal of AC signal detector 5 is connected to one input terminal of a Phase Comparator (601) which has its other input terminal connected to a Counter (609). The output signal from the Phase Comparator (601) is sent to a low pass filter circuit, which is comprised of two Resistors (602) (603) and a Capacitor (604), to control a Voltage Control Oscillator (606), so that the output frequency from the Voltage Control Oscillator (606) becomes N times its input frequency. The output signal from the Voltage Control Oscillator (606) is further sent through the Counter (609) and fed back to the Phase Comparator (601) to form a Phase-lock Circuit. The maximum operating frequency of the Voltage Control Oscillator (606) is determined by a Resistor (607) and a Capacitor (605), while its minimum operating frequency is determined by another Resistor (608) and the Capacitor (605). By means of a Monostable Trigger Circuit (701) and a NOR Gate (702), the output signal from the Voltage Control Oscillator (606) is provided for controlling the Voltage Sampling/Holding Circuit (3) and the Current Sampling/Holding Circuit (10) of FIG. 2. The output signal from the Monostable Trigger Circuit (701) and the Voltage Control Oscillator (606) is also sent through another two NOR Gates (703) (704) to further signal the Microprocessor to provide a control signal for controlling the operation of the Voltage A/D Converter (4) and the Current A/D Converter (11). The Microprocessor is simultaneously connected to the input terminal of the Phase-lock Circuit (6) to detect any possible error when the frequency of input signal is over the upper or lower limit of the Phase-lock Circuit.

After the foregoing analog signal is converted to digital signal, the Microprocessor starts its operation as follows:

1. Voltage/Current Root-Mean-Square:

$$Vrms = \sqrt{\frac{1}{T}\int_0^T V(t)^2 dt} = \left(\frac{1}{n}\sum_{j=1}^{n} Vj^2\right)^{\frac{1}{2}}$$

$$Irms = \sqrt{\frac{1}{T}\int_0^T I^2(t)dt} = \left(\frac{1}{n}\sum_{j=1}^{n} Ij^2\right)^{\frac{1}{2}}$$

in which: n is the number of equal parts that a voltage or current is divided at each cycle; T is the frequency of the voltage or current at each cycle; V(t), I(t) is the instantaneous voltage or current within t time; Vj, Ij is the instantaneous voltage or current at j equal part.

2. Average Power:

$$Pav = \frac{1}{T}\int_0^T V(t)I(t)dt = \frac{1}{n}\sum_{j=1}^{n} VjIj$$

3. Power Factor:

$$P.F. = \frac{P_{av}}{V_{rms} I_{rms}} = \frac{\frac{1}{\eta} \sum_{j=1}^{n} V_j I_j}{\left(\frac{1}{\eta} \sum_{j=1}^{n} V_j^2\right)^{\frac{1}{2}} \left(\frac{1}{\eta} \sum_{j=1}^{n} I_j^2\right)^{\frac{1}{2}}}$$

$0 \leq :PF: \leq 1$, PF's positive or negative sign is determined according to the sequence of voltage phase and current phase.

Through the above equations, the root-mean-square, average power and power factor of any voltage and current signal detected can be accurately measured out.

I claim:

1. A digitizing power meter for measuring voltage root mean square, average power, and power factor of an analog signal, comprising:

a first circuit system for converting the voltage component of an input analog signal into a first digital signal, said first circuit system including a voltage amplifier (1), a voltage sampling/holding circuit (3), and a voltage A/D converter (4);

a second circuit system for converting the current component of the input analog signal into a second digital signal, said second circuit system including an ampere amplifier (8), a current sampling/holding circuit (10), and a current A/D converter 11;

a signal detector means (5) connected to said voltage amplifier and to said ampere amplifier for producing a square wave signal;

a phase lock circuit (6) connected to said signal detector means for changing the frequency of the square wave signal;

a trigger circuit (7) having its input connected to the output of the phase lock circuit for developing a timing signal; said trigger circuit having separate outputs connected to said voltage sampling/holding circuit, said current sampling/holding circuit, said voltage A/D converter, and said current A/D converter for delivering timing signals thereto;

a digital signal processing circuit comprising a microprocessor (18) and a RAM (17), and a photo isolator (19) having a first side thereof connected to said digital signal processing circuit, and a second side thereof connected to said trigger circuit and to said A/D converters.

2. The digitizing power meter of claim 1, wherein said voltage sampling/holding circuit (3) comprises an operational amplifier (407), a first photo-coupler (405) for delivering an input signal to one input terminal of said operational amplifier, and a second photo-coupler (414) connected to the output of said amplifier (407) for delivering a reference signal to a second input terminal of said operational amplifier.

* * * * *